(12) United States Patent
Halliday

(10) Patent No.: US 8,906,177 B2
(45) Date of Patent: Dec. 9, 2014

(54) METHOD FOR CONTROLLING GLUE FLOW

(75) Inventor: William Halliday, Edinburgh (GB)

(73) Assignee: STMicroelectronics (Research & Development) Limited, Marlow, Buckinghamshire (GB)

( * ) Notice: Subject to any disclaimer, the term of this patent is extended or adjusted under 35 U.S.C. 154(b) by 588 days.

(21) Appl. No.: 13/235,945

(22) Filed: Sep. 19, 2011

(65) Prior Publication Data
US 2012/0138222 A1 Jun. 7, 2012

(30) Foreign Application Priority Data

Dec. 1, 2010 (GB) .................................. 1020291.9

(51) Int. Cl.
| | | |
|---|---|---|
| B29C 65/04 | (2006.01) | |
| B29C 65/48 | (2006.01) | |
| B32B 37/10 | (2006.01) | |
| B32B 37/12 | (2006.01) | |
| H05K 3/32 | (2006.01) | |
| H05K 3/30 | (2006.01) | |

(52) U.S. Cl.
CPC ............... *H05K 3/305* (2013.01); *H05K 3/321* (2013.01); *H05K 2201/10151* (2013.01); *H05K 2203/105* (2013.01)
USPC .... 156/64; 156/272.2; 156/273.1; 156/273.3; 156/273.5; 156/273.7; 156/274.4; 156/274.8; 156/275.7; 427/187; 427/207.1; 427/510; 427/532

(58) Field of Classification Search
CPC ............ B05C 11/10; B05D 3/06; B05D 3/14; B05D 5/10; B29C 65/04; B29C 65/48; B32B 3/10; B32B 37/12; B32B 41/00; B32B 41/02
USPC ............... 156/64, 272.2, 273.1, 273.3, 273.5, 156/273.7, 274.4, 274.8, 275.7; 118/600; 427/187, 207.1, 510, 532; 428/195.1
See application file for complete search history.

(56) References Cited

U.S. PATENT DOCUMENTS

2011/0151202 A1* 6/2011 Feinstein et al. ........... 428/195.1

FOREIGN PATENT DOCUMENTS

JP 2010258030 A 11/2010

OTHER PUBLICATIONS

UK Search Report mailed Mar. 16, 2011, for GB 1020291.9 (1 page).
English Language Abstract for JP 2010258030 A1 (1 page).

* cited by examiner

*Primary Examiner* — George Koch
(74) *Attorney, Agent, or Firm* — Gardere Wynne Sewell LLP

(57) ABSTRACT

A method for controlling a contact angle between a glue and a surface of a substrate during manufacture of microchip packages is disclosed. The method includes applying a glue to a surface of a substrate, and placing an electrode in electrical connection with the glue. A potential difference is applied between the electrode and the substrate. The potential difference is applied across the glue and causes a contact angle between the glue and the surface of the substrate to be altered.

18 Claims, 6 Drawing Sheets

METHOD FOR CONTROLLING GLUE FLOW

PRIORITY CLAIM

This application claims priority from United Kingdom Application for Patent No. 1020291.9 filed Dec. 1, 2010, the disclosure of which is hereby incorporated by reference.

TECHNICAL FIELD

The invention relates to controlling a contact angle between a glue and a surface of a substrate in microchip manufacture, thereby controlling the flow rate of the glue.

BACKGROUND

Glues are generally liquids. In microchip package manufacture, glues are often dispensed onto a substrate using a continuous glue bead. Continuous glue beads generally comprise the same glue type and do not generally include different glue types at different places along the length of the bead.

Additional elements of a microchip package may be secured to the substrate by contacting the elements with the glue and allowing the glue to cure.

When glues are dispensed onto substrates in microchip manufacturing processes they may not flow as well as might be expected or required. Similarly, glue may flow more than desired. In some cases, flow may require to be restricted or encouraged at different places. This may be the case despite the glue being the same type and comprised within a continuous glue bead.

Different glue types have different characteristics and, in particular, exhibit different flow rates. Glue flow rate is a typical means of controlling which areas of a substrate a glue will flow onto. Glue flow rate is typically used together with a number of other factors such as the height of a glue dispensing needle above the substrate, the rate of movement of a glue dispensing needle, and the spin rate of the needle, all of which can affect the flow of a glue on a substrate. In general, therefore, present methods for controlling the flow of a glue are limited to mechanical processes.

It is common for different types of glue to be deposited in close proximity to each other. In some circumstances, problems may occur if the different glue types mix. This is particularly the case if conductive glue contaminates non-conductive glue and vice versa, as this will affect the conductive and/or non-conductive properties of each glue.

In terms of gluing, known solutions employ a multi-pass assembly approach depositing non-conductive glue, assembling and curing, and then applying conductive glue, assembling and curing. Often access to the electrical joints are restricted during the second pass requiring more complex techniques to be applied such as additional handling of the component being assembled or using a solder-ball or conductive-paste firing technique.

In camera module design, the need to support lens mounts which incorporate active components is increasing and microchip package sizes are decreasing making it more difficult to keep glues of different types separated on a substrate. Using present methods of glue flow control may result in poor reliability on electrical joints made using conductive glue where non-conductive glue has been used as part of module assembly. Often such methods result in cross contamination of glues as other elements such as lens mounts are assembled onto the substrate.

SUMMARY

According to the disclosure, in a first aspect there is provided a method for controlling a contact angle between a glue and a surface of a substrate during manufacture of microchip packages, the method comprising: applying a glue to a surface of a substrate; placing an electrode in electrical connection with the glue; and applying a potential difference between the electrode and the substrate wherein the potential difference is applied across the glue and causes a contact angle between the glue and the surface of the substrate to be altered.

Controlling the contact angle of the glue on the substrate allows control of the flow of the glue on the substrate. By applying a potential difference across the glue, the interfacial energy at the glue-substrate interface is altered. This has the effect of increasing or decreasing the surface area of the interface. An increase in the surface area of the glue-substrate interface results in a decrease in the contact angle between the glue and the substrate as a finite amount of glue is spread across the increased surface area of the interface. Conversely, a decrease in the surface area of the glue-substrate interface results in an increase in the contact angle between the glue and the substrate as the glue is constricted into a taller droplet.

The term "interfacial energy" encompasses the energy at the interface between two materials. In the example of a droplet of glue on a substrate, three materials may be defined: the first and second are the substrate and the glue respectively; and the third is the ambient medium. Often the ambient medium refers to the air surrounding the glue and the substrate. However, other liquids or gases may be used. In general terms it can be said that the glue and the ambient medium must at least be immiscible. Interfacial energies can be defined in respect of the glue-substrate interface and the glue-ambient medium interface. The interfacial energy may be defined as the amount of energy G required under reversible isothermal conditions to increase the surface area of an interface at constant volume according to:

$$\gamma_{ij} = \frac{dG}{dA}\bigg|_{T=const, V=const}$$

where $\gamma_{ij}$ is the interfacial energy, A is the surface area of the interface, T is temperature and V is volume.

If the contact angle is reduced, then this can be considered to increase the flow of the glue as the glue is encouraged to spread further over the substrate due to the increased surface area of the glue-substrate interface. If the contact angle is increased, then the flow of the glue is considered to be decreased as the glue is restricted from spreading over the substrate due to the reduced surface area of the glue-substrate interface. Applying a potential difference across a glue allows the control of the contact angle of the glue to the substrate and thereby control of glue flow.

As used herein, the term "contact angle" encompasses the angle that the surface of a droplet of an electrolyte substance makes with a substrate to which it is applied at the point where the droplet contacts the substrate. The contact angle may be tangential to a curved surface of the droplet, the tangent extending from a point of contact between the droplet and the substrate. For example, in the hypothetical scenario where the droplet has vertical sides when applied to a horizontal substrate, the contact angle between the droplet and the substrate is ninety degrees. In a further example, in the hypothetical scenario where the droplet is entirely flat against the surface of the substrate then the contact angle is zero degrees. However, it is noted that a contact angle of greater than ninety degrees may be achieved given the correct conditions.

The substrate may comprise a conducting layer, and applying the potential difference may comprise applying a voltage to the conducting layer.

Including a conducting layer within the substrate allows a charge to be applied to the conducting layer when applying a potential difference across the glue.

The conducting layer may be insulated from the glue by a non-conducting layer. The non-conducting layer may be a film or a solder-resist layer.

The conducting layer may be a copper ring. The copper ring may be formed as part of standard printed-circuit board electrical traces. The non-conductive layer may be the solder-resist layer, such as those typically applied to printed-circuit boards to control the flow of solder during manufacture. The conductive ring may subsequently facilitate improved electromagnetic compatibility (EMC) and electrostatic discharge (ESD) performance by contributing to an overall shielding solution after the gluing process has been completed.

The substrate may further comprise a solder-resist layer at least partially covering the conducting layer and forming the surface of the substrate, wherein applying the glue to the surface of the substrate comprises applying the glue to the solder-resist layer.

The surface of the substrate may comprise a hydrophilic material, and applying the potential difference may increase the contact angle between the glue and the surface of the substrate.

As stated above, increasing the contact angle of the glue to the substrate restricts the flow of the glue. This prevents the glue spreading into areas where it is not required or may interfere with other glues or package components.

The electrode may comprise a package component to be glued to the substrate, and placing the electrode in electrical connection with the glue may comprise contacting the package component with the glue.

The electrode may comprise an exposed contact pad for the temporary application of voltage, and placing the electrode in electrical connection with the glue may comprise exposing the contact pad to the glue through an opening in the solder-resist layer By using a package component as the electrode, it is possible to apply the potential difference across the glue via the package component. This obviates the need to use a separate electrode and makes the process of glue flow control in manufacturing the package easier to implement and more efficient. The component may thus typically comprise a charge carrying, conductive material or electroplating forming the mount.

The package component may be a camera lens assembly. The package component may comprise an auto-focus lens actuator. The package component may comprise a mount for an auto-focus lens actuator. Applying the potential difference may comprise applying a neutral charge to the mount and applying a negative charge to the conducting layer.

The glue may be a non-conductive glue. The glue may be a conductive glue. The non-conductive glue may be glue mixed with an electrolytic substance.

Applying the potential difference may comprise applying the potential difference until the glue cures with the altered contact angle. This sets the glue in the controlled state. That is, the glue hardens in a shape controlled by the potential difference with a desired contact angle to the substrate.

Alternatively, the potential difference may be applied only to control the flow during the assembly operation, thereafter the glue flow would be controlled by the natural meniscus properties of the glue connecting the package component and substrate.

According to the disclosure in a second aspect, there is provided a method for manufacturing a microchip package comprising a method as described above. The method may further comprise contacting a package component to the glue and curing the glue to secure the microchip component to the substrate.

A plurality of microchip packages may be manufactured on a common substrate.

BRIEF DESCRIPTION OF THE DRAWINGS

Exemplary embodiments of the present disclosure are described below with reference to the accompanying drawings, in which.

DETAILED DESCRIPTION OF THE DRAWINGS

Figure 1:
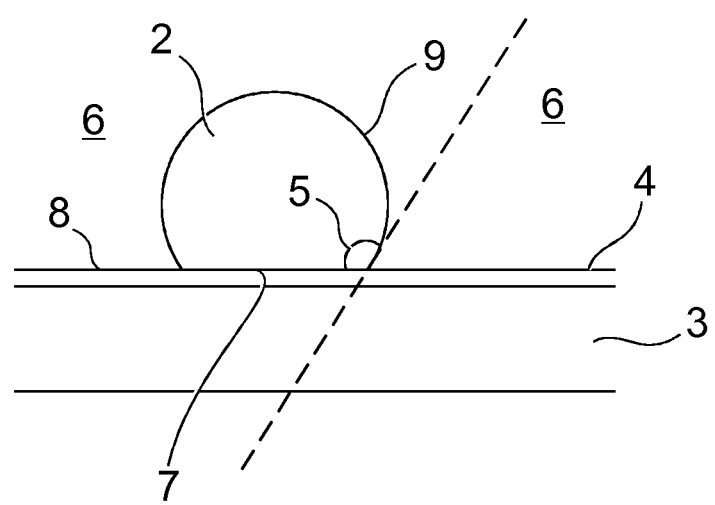
FIG. 1 shows a droplet applied to a substrate.

The inventors have realized that the principles of electrowetting may be applied to glue flow control in microchip package manufacture with advantageous results. The use of electrowetting in controlling the flow of liquids such as glues in microchip manufacture allows improved control of glue flow during assembly and reduces the possibility of mixing different glue types.

The principle of electrowetting exploits the surface tension characteristics of fluids by modifying the contact angle of a drop of electrolyte on a surface (typically metal). Using electrostatic forces, the contact angle of a drop of electrolyte on a surface can be altered, e.g. where a liquid droplet rests on a thin sheet of polytetrafluoroethylene ("PTFE"). The electrowetting effect may be defined as the change in electrolyte to solid contact angle due to an applied potential difference between the solid and the electrolyte.

Electrowetting may occur on two types of solid surface: hydrophilic; and hydrophobic. In addition, electrowetting may occur with the application of a positive or a negative charge or potential difference across an electrolyte droplet. There are therefore four possible combinations of solid surface and charge that may produce an electrowetting effect.

A droplet on a hydrophilic surface experiencing a positive charge results in a reduction in contact angle;

A droplet on a hydrophilic surface experiencing a negative charge results in an increase in contact angle;

A droplet on a hydrophobic surface experiencing a negative charge results in an increase in contact angle; and A droplet on a hydrophobic surface experiencing a positive charge results in a reduction in contact angle.

In the first combination mentioned above, the application of a positive electric field across the electrolyte droplet resting on a hydrophilic surface results in a fringing field at the corners of the droplet, which tends to pull the droplet down onto the solid surface. This lowers the macroscopic contact angle and increases the droplet contact area.

The derivation of electrowetting behaviour is given below by considering its thermodynamic model. Defining the relevant interfacial energies as:

$\gamma_{sl}$—The interfacial energy between a solid substrate and a droplet of electrolyte liquid;

$\gamma_{sl}^0$—The interfacial energy between a solid substrate and a droplet of electrolyte liquid at zero electric field;

$\gamma_{sv}$—The interfacial energy between a solid substrate and an external ambient medium; and $\gamma_{lv}$—The interfacial energy between a droplet of electrolyte liquid and an external ambient medium.

Further defining:

θ—The contact angle between an electrolyte and a dielectric;

C—The capacitance of the interface, $\in_r \in_0/t$, for a uniform dielectric of thickness t and permittivity $\in_r$; and V—The effective applied voltage, integral of the electric field from the electrolyte to the conductor.

Relating the total interfacial energy to its chemical and electrical components gives:

$$\gamma_{sl} = \gamma_{sl}^0 - \frac{CV^2}{2}$$

The contact angle is given by the Young-Dupre equation:

$$\gamma_{sl} = \gamma_{sv} + \gamma_{sl}\cos(\theta)$$

Combining the two equations gives the dependence of θ on the effective applied voltage as:

$$\theta = \cos^{-1}\left(\frac{\gamma_{sl}^0 - \gamma_{sv} - \frac{CV^2}{2}}{\gamma_{lv}}\right)$$

FIG. 1 shows a droplet of electrolyte 2 applied to a solid substrate 3. The substrate 3 comprises a dielectric layer 4. The droplet 2 forms a contact angle 5 with the solid substrate. The ambient medium 6 is shown surrounding the droplet 2 and the substrate 3. The interfacial energy $\gamma_{sl}$ exists at the interface between the droplet 2 and the substrate 3 as shown by reference numeral 7. The interfacial energy $\gamma_{sv}$ exists at the interface between the substrate 3 and the ambient medium 6 as shown by reference numeral 8. The interfacial energy $\gamma_{lv}$ exists at the interface between the droplet 2 and the ambient medium 6 as shown by reference numeral 9.

The principles of electrowetting have not been used previously to control the flow of a glue in the manufacture of microchip packages. The use of such methods provides the advantageous result that glues used may be controlled so as not to interfere with other package components or other glue types. Further, the accuracy with which glues may be applied to a substrate is greatly improved. Yet further, two types of glue may be applied to a substrate simultaneously, i.e. a second glue may be applied without waiting for a first glue to cure, without fear of cross contamination. This provides increased efficiencies in the manufacturing process.

Excessive glue flow can be discouraged by applying the principles of electrowetting to glues. Similarly glue flow can be encouraged where required to increase coverage over an area. Joint reliability (particularly conductive adhesive joints) can be maintained by preventing cross contamination when two glues are used in a single assembly process flow, which obviates the need for a double-pass assembly flow for two different glues. Situations were precise glue volumes are required may be improved by ensuring the glue stays exactly where it needs to.

Referring to FIG. 2, four steps involved in a process of controlling a contact angle between a glue and a surface of a substrate during microchip manufacture are shown. The steps are referenced a-d. The steps shown in FIG. 2 may be used as part of a process for manufacturing microchips. Specifically, the steps shown in FIG. 2 may be used to secure a lens mount to a substrate as part of a process for manufacturing camera modules.

Figure 2A:
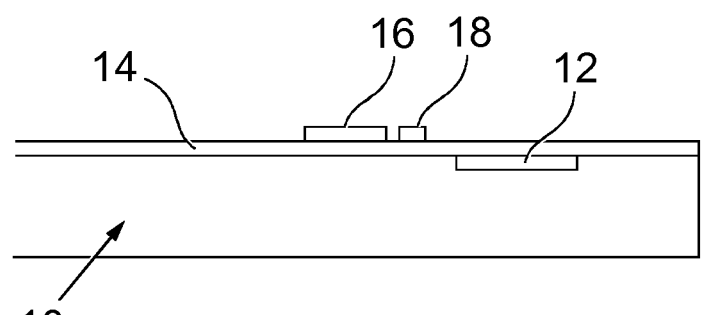
FIG. 2 *a-d* shows the steps involved in a process according to the present disclosure.

FIG. 2a shows a substrate arrangement comprising a substrate 10. The substrate 10 may be an FR4 substrate comprising a glass reinforced epoxy printed circuit board carrying an image sensor and surface mount device (SMD) components.

The substrate 10 includes a copper conducting ring 12, which is a conducting layer. The copper ring 12 may be included in the substrate to allow the implementation of the present disclosure. In addition, the copper ring may also be utilised to improve the EMC or ESD performance of the microchip package. Improved EMC and ESD performance are common goals in the manufacture of camera modules for use in e.g. mobile telephone handsets. Embodiments of the invention are adapted to advantageously make use of the copper ring that may be included in the substrate of microchip packages to improve EMC and ESD performance. However, in other embodiments one or more specific conducting layers may be added to a substrate for applying a potential difference across the glue.

The substrate 10 further comprises a solder mask (or solder-resist layer) 14 that at least partially covers the copper ring. A solder-resist layer 14 is a common feature of microchip manufacturing processes and will be well known to a person skilled in the art. Additionally, an electrical component 16 and a connection pad 18 have been illustrated in FIG. 2a to show possible positions of such elements.

Figure 2B:
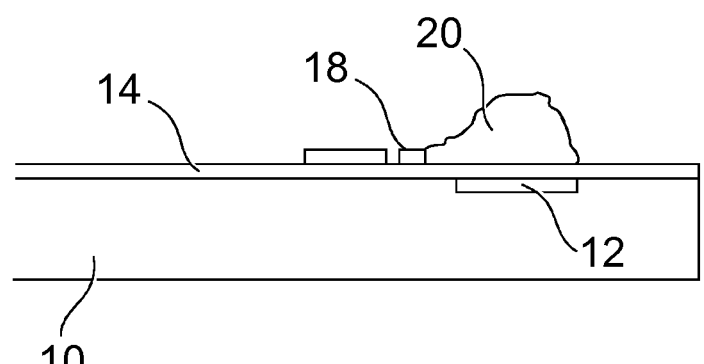

FIG. 2b shows an amount of a glue 20 applied to the surface of the substrate 10. The glue 20 is applied on the solder-resist layer 14, which forms the surface of the substrate 10, in a position dictated by the design of the microchip package. Package components are required to be fixed to the substrate arrangement, and the glue 20 is therefore deposited in the correct place to allow the package components to be fixed in the correct positions.

The glue 20 may be applied to the substrate 10 using standard machinery and techniques that will be known to a person of skill in the art. For example, machinery used for applying glue to a substrate arrangement in microchip package manufacture may have controllable speeds of deposition of the glue onto the substrate. Further, the height of the deposition machinery above the substrate may be controllable. These features allow the positioning of the glue in the required areas of the substrate.

However, the flow of the glue on the surface of the solder-resist layer 14 is less easily managed. It is not possible to be certain how the glue will behave once it is in contact with the surface of the solder-resist layer 14. The glue may for example flow very little and define a high contact angle with the solder-resist layer 14 as shown on the right hand side of the glue 20. Alternatively, the glue may flow to a greater extent and may define a reduced contact angle between the glue and the solder-resist layer as shown on the left hand side of the glue 20. Further, the glue may flow differently in different areas where it has been deposited. For example, the glue 20 deposited onto the solder-resist layer 14 in FIG. 2b has flowed to a greater extent on the left side than the right side.

It can be seen from FIG. 2b that the glue 20 has flowed to a degree where it is in contact with the connection pad 18, which is positioned in close proximity to where the glue has been deposited. The reduction in the size of microchip packages for modern devices places greater pressure on the manufacturing processes used as more components are required to be included in a small area. As this size reduction of microchip packages continues, the likelihood of deposited glue coming into contact with components of the package increases.

Figure 2C:
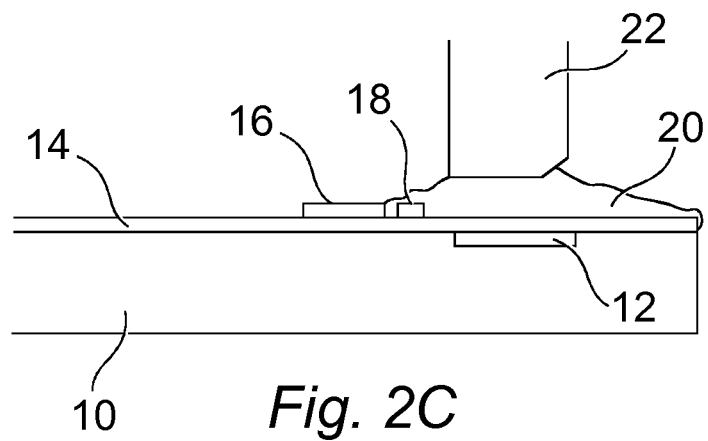

Referring to FIG. 2c, a mount 22 has been placed in contact with the glue 20. The mount 22 is required to be fixed in position on the substrate arrangement and is therefore held in contact with the glue 20 until it has cured. FIG. 2c shows that as the mount 22 has been placed on the glue 20, the glue 20 has been spread further across the surface of the solder-resist layer 14. The glue 20 has spread to such a degree that it covers the connection pad 18. This is a problem as the glue prevents connections being applied to the contact pad 18, which means that connections cannot be made to the electronic components positioned on the substrate. The glue has also spread such that it is in contact with the electronic component 16. This may affect the operation of the electronic component 16 and may in turn affect the functional reliability of microchip packages.

Further, the spread of the glue 20 has resulted in an amount of overflow of the glue 20 over an edge of the substrate arrangement. This may occur where glue is required to be deposited near an edge of a substrate arrangement.

The mount 22 forms an electrode that is in electrical connection with the glue 20. As used herein the term "electrode" encompasses any element placed in contact with the glue 20 for the purpose of placing a charge across the glue 20. In particular, the electrode is not required to have a high conductivity. For example, in some embodiments of the invention the mount 22 may be manufactured from acetate, which is not highly conductive. As will be described below, in such embodiments the mount 22 is held at a neutral potential and a negative charge is applied to the copper ring 12. However, the invention is not limited to use with acetate mounts or non-highly conductive electrodes.

Figure 2D:
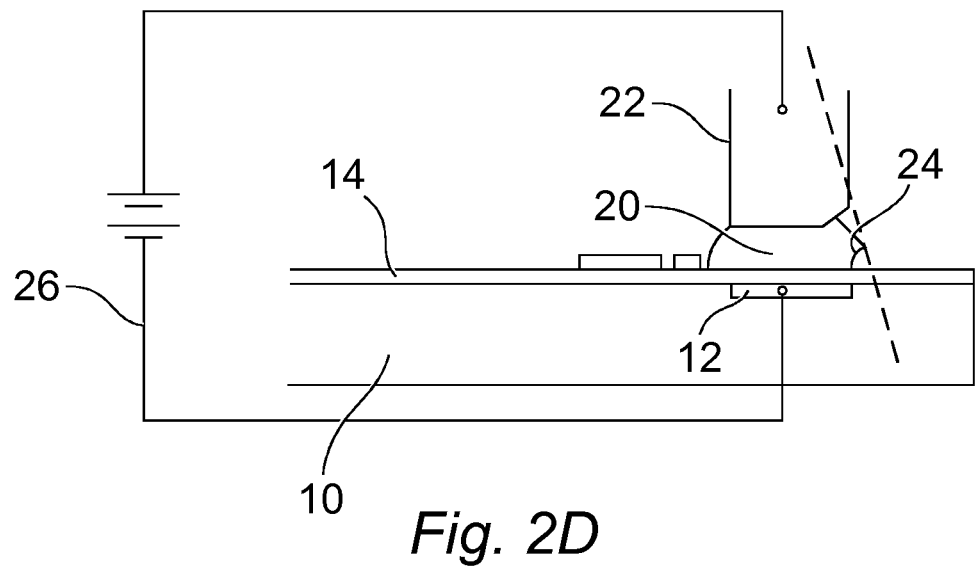

Referring to FIG. 2d a potential difference is placed across the glue 20 to increase a contact angle 24. The potential difference is represented schematically by the electric circuit 26 connected to the mount 22 and the copper ring 12.

In some embodiments, the potential difference may be anything up to a few hundred volts, for example 500 volts.

In the specific embodiment of FIG. 2, the mount 22 is manufactured from acetate, which is not highly conductive and is difficult to apply a significant charge to. The mount 22 is therefore held at neutral potential. In addition, the solder-resist layer is a hydrophilic material. A negative charge is applied to the copper ring 12. A negative potential difference is therefore seen across the glue 20 and this combined with the hydrophilic material of the solder-resist layer has the effect of increasing the contact angle 24 between the glue 20 and the surface of the solder-resist layer 14.

As a result of the increased contact angle 24, the flow of the glue 20 is restricted and the glue 20 is therefore kept away from the electronic component 16 and the connection pad 18. This prevents the glue interfering with the operation of the electronic component 16 and allows connections to be established with the connection pad 18. Further, the increase in the contact angle 24 restricts the flow of the glue such that it does not spill over the edge of the substrate 10.

Scenarios are envisaged whereby the flow of the glue 20 does not need to be restricted but rather may be encouraged. That is it may be necessary to reduce the contact angle 24 between the glue 20 and the substrate 10 to spread the glue further over the substrate 10. A positive potential difference may therefore be applied across the glue 20 to reduce the contact angle 24 between the glue 20 and the substrate 10.

Additionally, the magnitude of the potential difference applied across the glue is proportional to the contact angle between the glue and the substrate according to the above equation. The effects of electrowetting on the flow control of a glue can therefore be varied by varying the potential difference applied.

Further, different potential differences may be applied to different applications of glue. For example, a first glue deposited on a first area of a substrate may be required to flow in a particular way. A first potential difference may therefore be applied across the first glue. However, a second glue deposited on a second area of the substrate may be required to flow in a way different from the first glue. A second potential difference may therefore be applied across the second glue.

Such embodiments may require a two-pass manufacturing process where the first glue is allowed to cure before application of the second glue. Alternatively, the substrate may comprise first and second conductive layers that may have first and second charges applied to them to apply the first and second potential differences across the first and second glues simultaneously.

Figure 3:
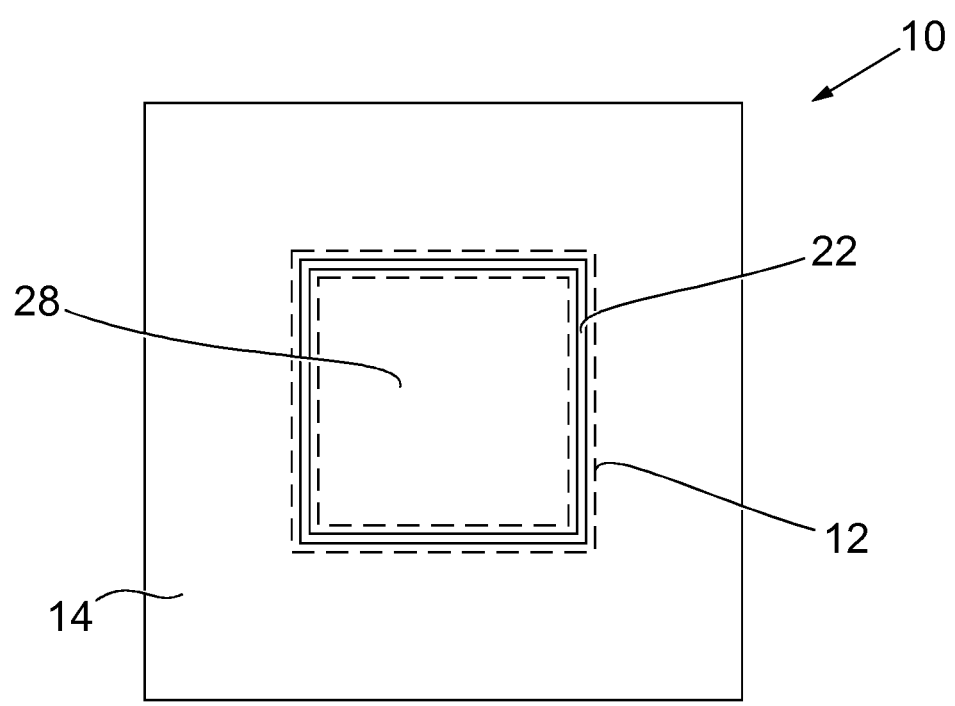
FIG. 3 shows a plan view of a microchip package wherein a mount is glued to a substrate.

Referring to FIG. 3, there is shown a typical plan view of a microchip package during manufacture. The substrate 10 comprises the copper ring 12 and the solder-resist layer 14, and a mount 22 is fixed to the substrate 10. The copper ring 12 forms a rectangle that surrounds an active component area 28, on which is placed active electronic components and connection pads.

Figure 4:
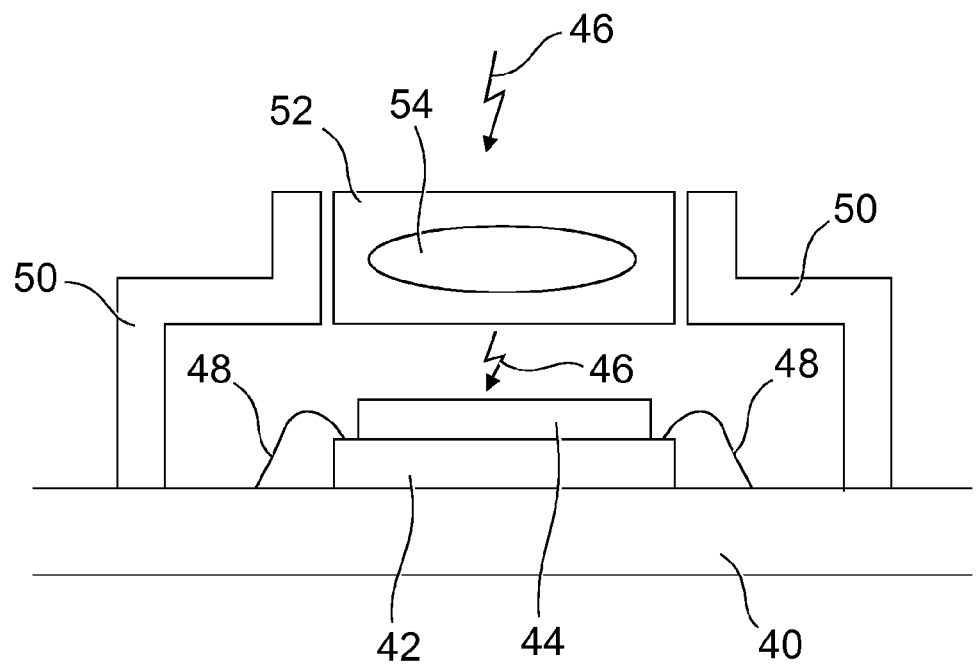
FIG. 4 shows a schematic representation of a cross section through a camera module.
Figure 5:
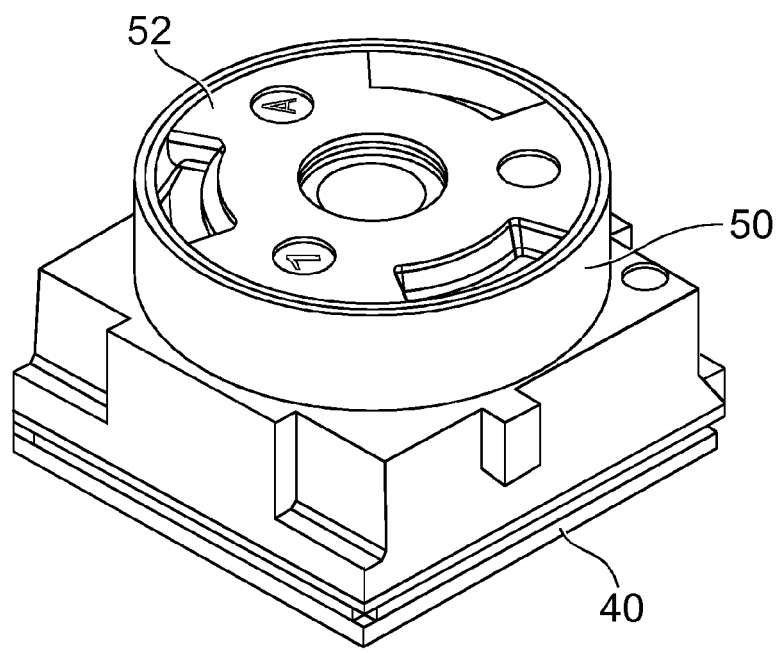
FIG. 5 shows a perspective view of a camera module.

FIG. 4 shows a schematic representation of a section through a camera module manufactured according to the present disclosure. Selected components are shown for ease of illustration in the present disclosure and it is to be understood that other components could be incorporated into the structure. A substrate 40 is provided upon which an imaging die 42 is assembled. The substrate 40 could be a PCB, ceramic or other material. The imaging die 42 comprises a radiation sensitive portion 44 which collects incident radiation 46. For an image sensor the radiation sensitive portion will usually be photosensitive and the incident radiation 46 will usually be light including light in the (human) visible wavelength ranges as well as perhaps infrared and ultraviolet. Bond wires 48 are provided for forming electrical connections with the substrate 40. Other electrical connections are possible, such as solder bumps for example. A number of electrical components are formed in the body of the imaging die 42 and/or the substrate 40. These components control the image sensing and readout operations and are required to switch at high speed. The module is provided with a mount 50, a lens housing 52 and lens 54 for focussing incident radiation 46 onto the radiation sensitive portion of the image sensor. The mount 50 may be glued to the substrate 40 in accordance with the present disclosure. FIG. 4 shows a perspective view of the apparatus of FIG. 5, showing the substrate 40, mount 50, and lens housing 52.

Figure 6:
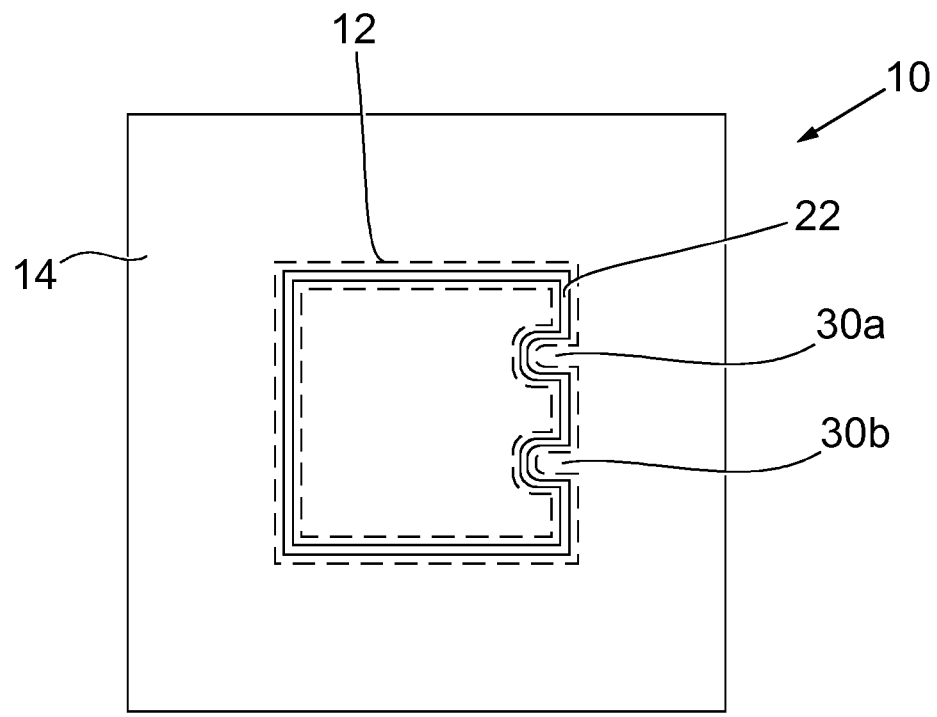
FIG. 6 shows a plan view of a microchip package wherein a mount is glued to a substrate and areas are provided for non-conductive and conductive glue deposition.

Referring to FIG. 6, a plan view of a particular arrangement of a substrate and mount for camera module for a mobile telephone handset is shown. The arrangement of FIG. 6 shows a substrate 10 comprising a copper ring 12 and a solder-resist layer 14, and a mount 22 is fixed to the substrate as in FIGS. 1 and 2. The mount 22 of FIG. 6 has recessed areas 30a, 30b.

The copper ring 12 follows the line traced by the mount 22 on the substrate and therefore also defines recessed areas 30a, 30b.

The recessed areas 30a, 30b are to allow for the electrical contacts of a lens focussing actuator which will be secured by conductive glue. The recessed areas 30a, 30b are outside the mount 22 and the non-conductive glue ring to reduce the risk of foreign material landing on the sensor which is sealed within the sealed cavity created by the mount 22 and the non-conductive glue ring.

The recessed areas 30a, 30b are required to accept a conductive glue. In contrast, the glue used to secure the mount to the substrate 10 is a non-conductive glue. In the arrangement of FIG. 6, it is desirable to keep the non-conductive glue separate from the conductive glue. That is, it is desirable to avoid cross contamination between conductive glue and non-conductive glue.

Therefore, when manufacturing microchip packages to the design shown in FIG. 6 the method of glue flow control described above may be applied to the non-conductive glue to secure the mount and to the conductive glue applied in the recessed areas 30a, 30b. By applying a potential difference across both types of glue when they are applied to the substrate 10 the area in which the glue will flow may be controlled and the two types of glue are kept separate.

By applying the glue flow control method of the disclosure to the conductive and non-conductive glue types, both of these glues may be applied to the substrate at the same time. That is the second glue to be applied may be applied to the substrate before the first glue to be applied has cured. This results in advantages in efficiency of manufacturing process over known methods in which the first glue must cure before the second glue may be applied in order to prevent cross contamination.

Figure 7:
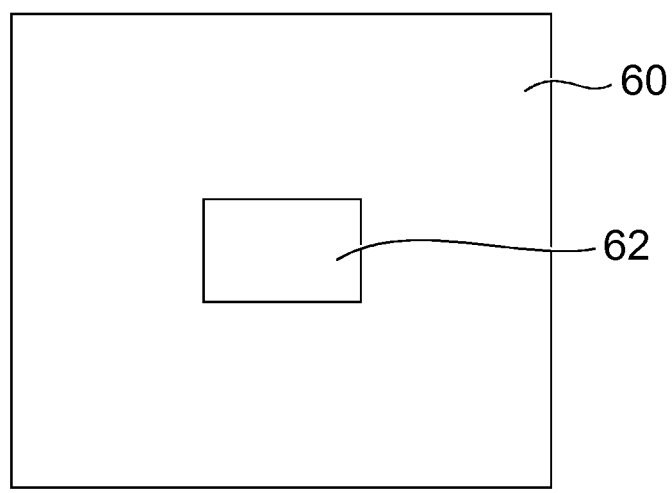
FIG. 7 shows a device comprising a camera module.

Camera modules may be manufactured according to the method of the present disclosure. The camera modules can be incorporated in a wide variety of devices. FIG. 7 shows a schematic representation of an example of a device 60 incorporating a device 62, such as a camera module, manufactured according to the disclosure. The device 60 may be without limitation a scanner (including hand held or a flat bed scanners), other document scanning equipment, industrial measurement equipment or machine vision equipment. The camera module 62 may be incorporated into that device 60 depending upon the nature of the device in a manner which is known to a person skilled in the art and which does not require further exemplification herein.

A plurality of microchip packages may be manufactured simultaneously on a single panel. A plurality of microchip packages may be arranged on a common substrate and the copper ring of each microchip package may be connected to a common electrical connection. The electrical connection is suitable for connecting to an external voltage source for supplying a charge to the copper rings of each microchip package.

Using such an arrangement, a glue may be dispensed onto each area of substrate corresponding to a particular microchip package for securing package components to the substrate. The package component may for example be a lens mount. A mount corresponding to each microchip package may then be placed in contact with the glue for securing it to the substrate. The mounts may then be held at a neutral potential while a charge is applied to the electrical connection. The charge applied to the electrical connection is passed to a copper ring corresponding to each microchip package thereby altering the contact angle between the glue and the substrate surface. In some embodiments the contact angle may be decreased to restrict the flow of the glue on the substrate surface.

The charge applied to the panel to control glue spreading may share existing electrical connections already installed to support electroplating techniques, which are often used in the fabrication of such substrates.

Once the manufacturing process has been completed the individual microchip packages may be separated from each other.

Other embodiments of the disclosure are envisaged without departing from the scope of the disclosure as claimed.

For example, the solder-resist layer is not essential to the method of the disclosure. In some embodiments, the solder-resist layer may be omitted and the glue may be applied directly to the substrate. In embodiments comprising no solder-resist layer, the substrate surface may be hydrophilic.

Further, in some embodiments there is no requirement for a conducting layer. For example, if the substrate comprises no conducting layer then the potential difference may be applied across the glue by virtue of the electrode and the substrate. The substrate may be held at neutral potential and a charge may be applied to the electrode. The electrode may comprise a package component to be secured to the substrate or may be a separate electrode placed in electrical connection with the glue. It should be appreciated that where the mount is the electrode, the mount may be conductive and therefore may be used to apply the potential difference across the glue.

The copper ring is not an essential feature of the disclosure. In embodiments where there is no copper ring, tracks may be introduced to the substrate for the sole purpose of applying a potential difference across the glue.

The tracks may be insulated by a solder-resist layer and may be held at a specific potential during the manufacturing process.

The skilled person will be able to identify further embodiments of the disclosure without departing from the scope of the appended claims.

What is claimed is:

1. A method for controlling a contact angle between a glue and a surface of a substrate during manufacture of microchip packages, the method comprising:
    applying a glue to a surface of a substrate;
    placing an electrode in electrical connection with the glue;
    wherein the electrode comprises a package component to be glued to the substrate;
    wherein placing the electrode in electrical connection with the glue comprises contacting the package component with the glue; and
    applying a potential difference between the package component electrode and the substrate wherein the potential difference is applied across the glue and causes a contact angle between the glue and the surface of the substrate to be altered.

2. The method according to claim 1 wherein the substrate comprises a conducting layer and wherein applying the potential difference comprises applying a voltage to the conducting layer.

3. The method according to claim 2 wherein the conducting layer is a copper ring.

4. The method according to claim 2 wherein the conducting layer is a track formed on the substrate.

5. The method according to claim 2 wherein the substrate further comprises a solder-resist layer at least partially covering the conducting layer and forming the surface of the substrate, and wherein applying the glue to the surface of the substrate comprises applying the glue to the solder-resist layer.

6. The method according to claim 1 wherein the surface of the substrate comprises a hydrophilic material and applying the potential difference increases the contact angle between the glue and the surface of the substrate.

7. The method according to claim 1 wherein the package component electrode is a camera module lens assembly comprising a mount for an auto-focus lens actuator.

8. The method according to claim 7 wherein applying the potential difference comprises applying a neutral charge to the mount and applying a negative charge to the conducting layer.

9. The method according to claim 1 wherein the glue is a non-conductive glue.

10. The method according to claim 1 wherein the glue is a conductive glue.

11. The method according to claim 1 wherein applying the potential difference comprises applying the potential difference until the glue cures with the altered contact angle.

12. A method for manufacturing a microchip package comprising:
　　applying a glue to a surface of a substrate;
　　placing an electrode in electrical connection with the glue, said electrode comprising a package component placed in contact with the glue;
　　applying a potential difference between the package component electrode and the substrate wherein the potential difference is applied across the glue and causes a contact angle between the glue and the surface of the substrate to be altered; and
　　curing the glue to secure the package component to the substrate.

13. The method according to claim 12 wherein a plurality of microchip packages are manufactured on a common substrate.

14. The method according to claim 12 wherein:
　　the substrate comprises a copper ring;
　　applying the potential difference comprises applying a voltage to the copper ring; and
　　the substrate further comprises a solder-resist layer at least partially covering the conducting layer and forming the surface of the substrate, and wherein applying the glue to the surface of the substrate comprises applying the glue to the solder-resist layer.

15. The method according to claim 14 wherein the surface of the substrate comprises a hydrophilic material and applying the potential difference increases the contact angle between the glue and the surface of the substrate.

16. A method for manufacturing a microchip package comprising:
　　applying a glue to a surface of a substrate, the substrate comprising a conducting layer;
　　placing an electrode in electrical connection with the glue, wherein the electrode comprises a package component placed in contact with the glue;
　　applying a voltage across the conducting layer and package component electrode creating a potential difference across the glue; and
　　curing the glue to secure the package component to the substrate.

17. The method of claim 16 wherein the voltage is applied until the glue cures with an altered contact angle between the glue and the surface of the substrate.

18. The method according to claim 16 wherein the conducting layer is a track formed on the substrate.

\* \* \* \* \*